US009933468B2

(12) United States Patent
Zhou et al.

(10) Patent No.: US 9,933,468 B2
(45) Date of Patent: Apr. 3, 2018

(54) DETECTING DEVICE AND DETECTING METHOD FOR DETECTING OUTPUT IMPEDANCE ANGLE OF INVERTER

(71) Applicant: DELTA ELECTRONICS, INC., Taoyuan (TW)

(72) Inventors: Jian-Hong Zhou, Taoyuan (TW); Cheng Lu, Taoyuan (TW); Jia-Min Zhang, Taoyuan (TW); Hong-Yang Wu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/166,288

(22) Filed: May 27, 2016

(65) Prior Publication Data

US 2016/0349299 A1 Dec. 1, 2016

(30) Foreign Application Priority Data

May 29, 2015 (CN) .......................... 2015 1 0288495

(51) Int. Cl.
*H02M 7/44* (2006.01)
*G01R 27/26* (2006.01)
(Continued)

(52) U.S. Cl.
CPC ........... *G01R 27/26* (2013.01); *G01R 21/003* (2013.01); *G01R 25/00* (2013.01); *H02J 3/40* (2013.01); *H02M 7/44* (2013.01)

(58) Field of Classification Search
CPC ...... G01R 27/26; G01R 21/003; G01R 25/00; H02J 3/01; H02J 3/38; H02J 3/1814; H02J 3/40; H02M 7/44
See application file for complete search history.

(56) References Cited

U.S. PATENT DOCUMENTS 6,603,290 B2    8/2003   Hochgraf

FOREIGN PATENT DOCUMENTS

CN    103983898 A    8/2014
CN    104158222 A    11/2014
(Continued)

OTHER PUBLICATIONS

Juan C. Vasquez et al, "Adaptive Droop Control Applied to Distributed Generation Inverters Connected to the Grid", Industrial Electronics, 2008. ISIE 2008. IEEE International Symposium on, Jun. 1, 2008, pp. 2420-2425.
(Continued)

*Primary Examiner* — Alesa Allgood
(74) *Attorney, Agent, or Firm* — CKC & Partners Co., Ltd.

(57) ABSTRACT

A method for detecting an output impedance angle of an inverter includes controlling an inverter to output a second voltage signal and a current signal based on a first voltage signal; receiving the signals, and calculating and outputting first and second active powers, and first and second reactive powers using the signals; calculating and outputting third and fourth active powers, and third and fourth reactive powers based on the first and second active powers, the first and second reactive powers, and the predetermined impedance angle; determining whether the amplitude is a constant value; if so, determining whether an absolute value of the first differential value of the third and fourth reactive powers is less than a first power reference value; if so, the impedance angle outputted from the inverter is the impedance angle; if not, setting the impedance angle as the predetermined impedance angle plus or minus the compensation angle.

10 Claims, 7 Drawing Sheets

100

(51) Int. Cl.
    *G01R 25/00*     (2006.01)
    *H02J 3/40*     (2006.01)
    *G01R 21/00*     (2006.01)

(56) References Cited

FOREIGN PATENT DOCUMENTS

| | | |
|---|---|---|
| TW | 242203 B | 3/1995 |
| TW | 418594 B | 1/2001 |
| WO | 2014060065 A2 | 4/2014 |
| WO | WO2014060065   * 4/2014   ............... H20J 3/46 |

OTHER PUBLICATIONS

Adrian V. Timbus et al, "Grid Impedance Identification Based on Active Power Variations and Grid Voltage Control", Industry Applications Conference, 2007. 42nd IAS Annual Meeting. Conference Record of the 2007 IEEE, Sep. 1, 2007, pp. 949-954.

* cited by examiner

DETECTING DEVICE AND DETECTING METHOD FOR DETECTING OUTPUT IMPEDANCE ANGLE OF INVERTER

RELATED APPLICATIONS

This application claims priority to China Application Serial Number 201510288495.7, filed May 29, 2015, which is herein incorporated by reference.

BACKGROUND

Field of Invention

The present disclosure relates to detecting technology for performing detection with respect to inverters. More particularly, the present disclosure relates to a detecting device and a detecting method for detecting an output impedance angle of an inverter.

Description of Related Art

Inverters are power converting devices employing power electronics technology. Power can be converted from DC to AC through suitable control by inverters. When an output impedance of an inverter is pure inductive, an active power and a reactive power are decoupled. The active power of the inverter is mainly controlled by a power angle of a voltage, and the reactive power of the inverter is mainly controlled by an amplitude of a voltage.

Based on power-transmission principles, voltage source control-type inverters that are grid-connected or inverters connected in parallel usually use droop control. However, the output impedance of the inverter is usually inductive and resistive. Particularly when an inverter is connected to a low-voltage power grid, the active power and the reactive power are not decoupled. In this case, if a droop control is used, the coupling among the active power and the reactive power is high.

If an output impedance of an inverter can be obtained and a rotation matrix is employed, the rotated active power and reactive power are decoupled; therefore, a droop control can be used directly. Hence, to control an inverter efficiently, the foregoing output impedance must be obtained. However, there is no method at present which can automatically detect output impedance angles of inverters simply and accurately.

In view of the foregoing, problems and disadvantages are associated with existing products that require further improvement. However, those skilled in the art have yet to find a solution.

SUMMARY

The following presents a simplified summary of the disclosure in order to provide a basic understanding to the reader. This summary is not an extensive overview of the disclosure and it does not identify key/critical elements of the present disclosure or delineate the scope of the present disclosure.

One aspect of the present disclosure is directed to a detecting method for detecting an output impedance angle of an inverter, comprising (a) providing a first voltage signal, wherein the first voltage signal comprises an amplitude and a power angle, one of the amplitude and the power angle is a variable value, and the other one of the amplitude and the power angle is a constant value; (b) controlling an inverter to output a second voltage signal and a current signal based on the first voltage signal; (c) calculating and outputting a first active power, a second active power, a first reactive power, and a second reactive power based on the second voltage signal and the current signal; (d) setting an impedance angle to be an initial impedance angle; (e) setting a predetermined impedance angle to be the impedance angle; (f) calculating and outputting a third active power, a fourth active power, a third reactive power, and a fourth reactive power based on the first active power, the second active power, the first reactive power, the second reactive power, and the predetermined impedance angle; (g) determining whether the amplitude is a constant value; (h) if it is determined that the amplitude is a constant value, determining whether an absolute value of a first differential value of the third reactive power and the fourth reactive power is less than a first power reference value; (i) if it is determined that the absolute value of the first differential value is less than the first power reference value, setting the output impedance angle of the inverter as the impedance angle; (j) if it is determined that the absolute value of the first differential value is not less than the first power reference value, setting the impedance angle equal to a sum of the predetermined impedance angle and a compensation angle or as the predetermined impedance angle minus the compensation angle, and repeating step (e) to step (h) until it is determined that the absolute value of the first differential value is less than the first power reference value in step (i); (k) if it is determined that the amplitude is not a constant value, determining whether an absolute value of the second differential value of the third active power and the fourth active power is less than a second power reference value; (l) if it is determined that the absolute value of the second differential value is less than the second power reference value, setting the output impedance angle of the inverter as the impedance angle; (m) if it is determined that the absolute value of the second differential value is not less than the second power reference value, setting the impedance angle equal to the sum of the predetermined impedance angle and the compensation angle or to the predetermined impedance angle minus the compensation angle, and repeating step (e), step (f), step (g), step (k) until it is determined that the absolute value of the second differential value is less than the second power reference value in step (l).

Another aspect of the present disclosure is directed to a detecting device for detecting an output impedance angle of an inverter. The detecting device for detecting the output impedance angle of the inverter comprises a voltage signal setting unit, a control unit, a calculation unit, a rotation changing unit, and a detection unit. The voltage signal setting unit is configured to provide a first voltage signal, wherein the first voltage signal comprises an amplitude and an power angle, one of the amplitude and the power angle is a variable value, and the other one of the amplitude and the power angle is a constant value. The control unit is configured to control an inverter to output a second voltage signal and a current signal based on the first voltage signal. The calculation unit is configured to calculate and output a first active power, a second active power, a first reactive power, and a second reactive power based on the second voltage signal and the current signal. The rotation changing unit is configured to calculate and output a third active power, a fourth active power, a third reactive power, and a fourth reactive power based on the first active power, the second active power, the first reactive power, the second reactive power, and a predetermined impedance angle. The detection unit is configured to calculate an impedance angle and an output impedance angle of the inverter based on the third active power, the fourth active power, the third reactive power, the fourth reactive power, and the first voltage signal, wherein the detection unit is configured to set the impedance angle to be an initial impedance angle, and set the predetermined impedance angle to be the impedance angle. The detection unit is configured to determine whether the amplitude is a constant value, if it is determined that the amplitude is a constant value, determining whether an absolute value of a first differential value of the third reactive power and the fourth reactive power is less than a first power reference value; if it is determined that the absolute value of the first differential value is less than the first power reference value, setting the output impedance angle of the inverter as the impedance angle; if it is determined that the absolute value of the first differential value is not less than the first power reference value, setting the impedance angle as a sum of the predetermined impedance angle and a compensation angle or as the predetermined impedance angle minus the compensation angle; if it is determined that the amplitude is not a constant value, determining whether an absolute value of a second differential value of the third active power and the fourth active power is less than a second power reference value; if it is determined that the absolute value of the second differential value is less than the second power reference value, setting the output impedance angle of the inverter as the impedance angle; if it is determined that the absolute value of the second differential value is not less than the second power reference value, setting the impedance angle equal to the sum of the predetermined impedance angle and the compensation angle or to the predetermined impedance angle minus the compensation angle.

In view of the foregoing, embodiments of the present disclosure provide a detecting device and a detecting method for detecting an output impedance angle of an inverter so as to detect an output impedance angle of the inverter simply and precisely, thereby enabling efficient control of the inverter.

These and other features, aspects, and advantages of the present disclosure, as well as the technical means and embodiments employed by the present disclosure, will become better understood with reference to the following description in connection with the accompanying drawings and appended claims.

BRIEF DESCRIPTION OF THE DRAWINGS

The disclosure can be more fully understood by reading the following detailed description of the embodiment, with reference made to the accompanying drawings as follows.

In accordance with common practice, the various described features/elements are not drawn to scale but instead are drawn to best illustrate specific features/elements relevant to the present disclosure. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

For automatically detecting output impedance angles of inverters simply and accurately so as to enable efficient control of inverters, the present disclosure provides a detecting device and a detecting method for detecting an output impedance angle of an inverter, which will be described below.

Figure 1:
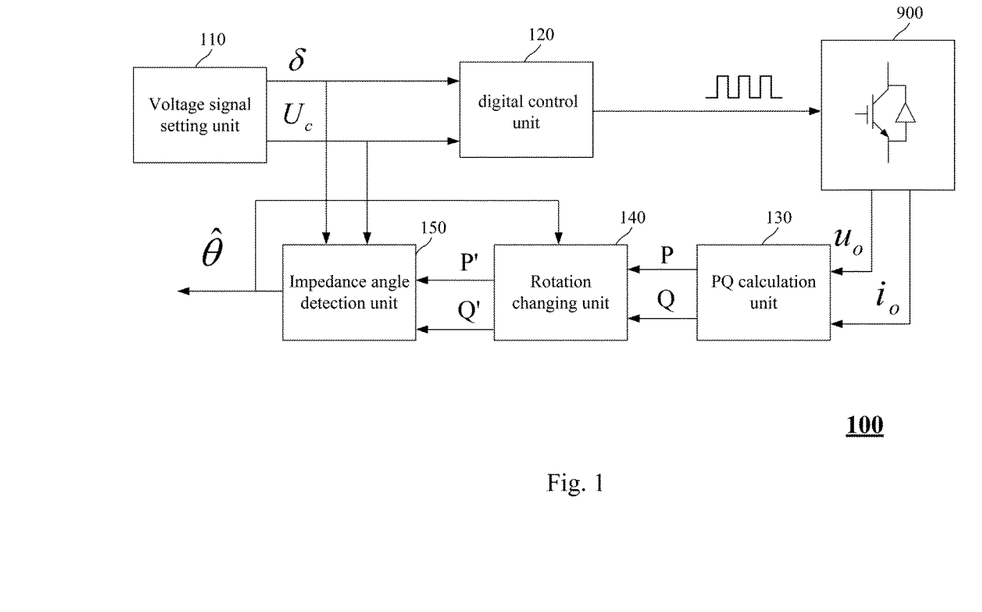
FIG. 1 is a schematic diagram of a detecting device for detecting an output impedance angle of an inverter according to embodiments of the present disclosure.

FIG. 1 is a schematic diagram of a detecting device for detecting an output impedance angle of an inverter according to embodiments of the present disclosure. As shown in the figure, the detecting device 100 for detecting an output impedance angle of an inverter comprises a voltage signal setting unit 110, a digital control unit 120, an active power/reactive power (PQ) calculation unit 130, a rotation changing unit 140, and an impedance angle detection unit 150.

In this embodiment, the voltage signal setting unit 110 is configured to output a first voltage signal, and the first voltage signal comprises an amplitude $U_c$ and an power angle δ. In one embodiment, an output side of an inverter 900 is coupled to a grid. The power angle δ can be a phase difference between the first voltage signal and a voltage of the grid, but is not limited thereto. One of the amplitude $U_c$ and the power angle δ is a variable value, and the other one of the amplitude $U_c$ and the power angle δ is a constant value. The digital control unit 120 is configured to control the inverter 900 to output a second voltage signal $u_0$ and a current signal $i_0$ based on the first voltage signal. The PQ calculation unit 130 is configured to calculate and output a first active power $P_1$, a second active power $P_2$, a first reactive power $Q_1$ and a second reactive power $Q_2$ based on the second voltage signal $u_0$ and the current signal $i_0$. The rotation changing unit 140 is configured to calculate and output a third active power $P_1'$, a fourth active power $P_2'$, a third reactive power $Q_1'$ and a fourth reactive power $Q_2'$ based on the first active power $P_1$, the second active power $P_2$, the first reactive power $Q_1$, the second reactive power $Q_2$ and a predetermined impedance angle $\hat{\theta}$. The impedance angle detection unit 150 is configured to calculate the output impedance angle based on the third active power $P_1'$, the fourth active power $P_2'$, the third reactive power $Q_1'$, the fourth reactive power $Q_2'$ and the first voltage signal.

Figure 2A:
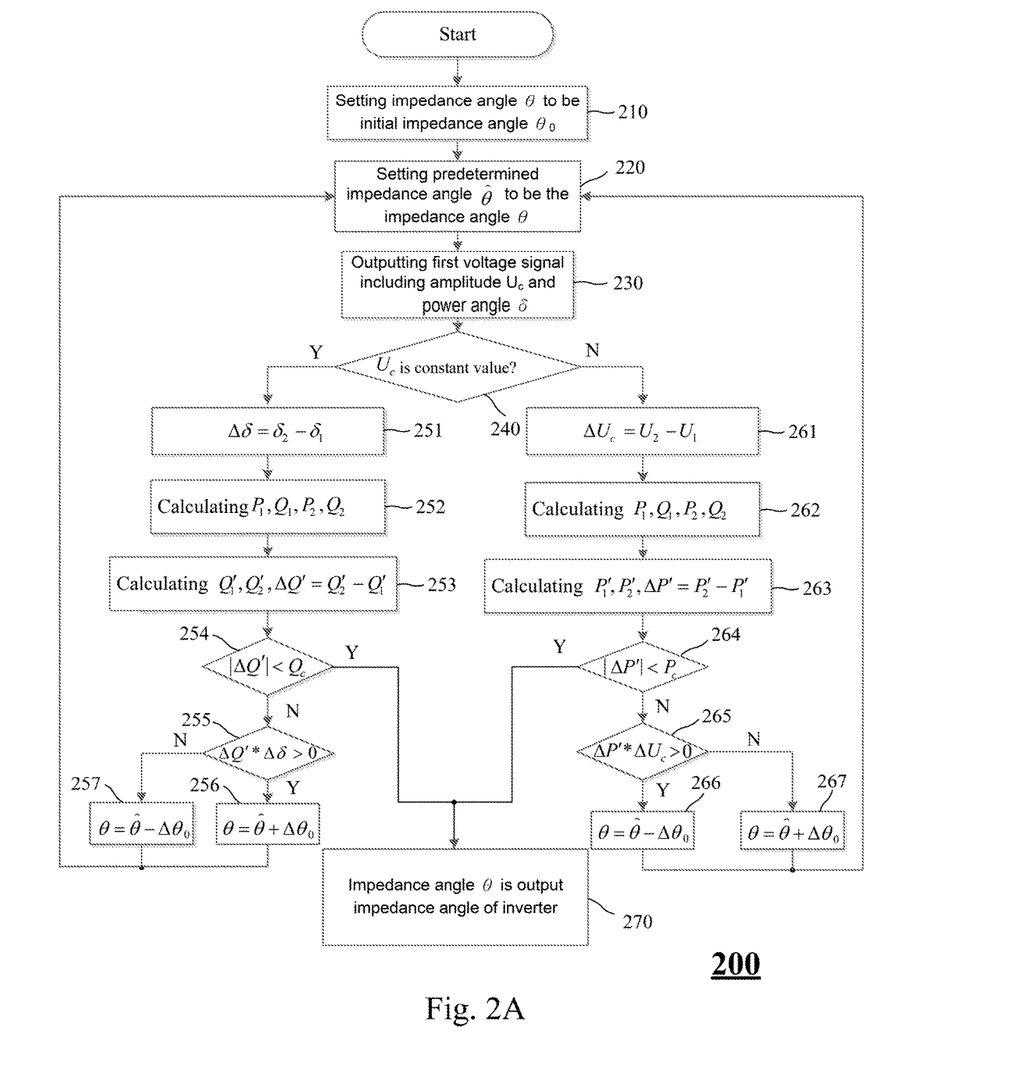
FIG. 2A is a flow diagram illustrating the process steps of a detecting method for detecting an output impedance angle of an inverter according to embodiments of the present disclosure.

For facilitating understanding of steps for detecting an output impedance angle of an inverter of the detecting device 100, reference is now made to FIG. 2A, which is a flow diagram illustrating the process steps of a detecting method for detecting an output impedance angle of an inverter according to embodiments of the present disclosure. As shown in the figure, in step 210, an impedance angle θ is set to be an initial impedance angle $θ_0$. In step 220, a set predetermined impedance angle $\hat{\theta}$ is set to be an impedance angle θ. In step 230, the voltage signal setting unit 110 is used to output the first voltage signal, and the first voltage signal comprises the amplitude $U_c$ and the power angle δ. In step 240, the impedance angle detection unit 150 is used to determine whether a value of the amplitude $U_c$ is a constant value. If it is determined that the value of the amplitude $U_c$ is a constant value, step 251 is performed to calculate a variance Δδ of the power angle δ. For example, if the power angle δ changes from $δ_1$ to $δ_2$, the variance $Δδ=δ_2-δ_1$.

Subsequently, steps 252~253 can be performed in advance, or performed after step 251. In step 252, the PQ calculation unit 130 is used to calculate the first active power $P_1$, the second active power $P_2$, the first reactive power $Q_1$ and the second reactive power $Q_2$ based on the second voltage signal $u_0$ and the current signal $i_0$. The first active power $P_1$ and the first reactive power $Q_1$ are calculation values when the power angle is $δ_1$. The second active power $P_2$ and the second reactive power $Q_2$ are calculation values when the power angle is $δ_2$. In step 253, the rotation changing unit 140 is used to calculate the third reactive power $Q_1'$ and the fourth reactive power $Q_2'$, and calculate a first differential value ΔQ' of the reactive power Q' (ΔQ'=$Q_2'-Q_1'$) based on the first active power $P_1$, the second active power $P_2$, the first reactive power $Q_1$, the second reactive power $Q_2$ and the predetermined impedance angle $\hat{\theta}$. The third reactive power $Q_1'$ is a calculation value of the first active power $P_1$, the first reactive power $Q_1$ and the predetermined impedance angle $\hat{\theta}$. The fourth reactive power $Q_2'$ is a calculation value of the second active power $P_2$, the second reactive power $Q_2$ and the predetermined impedance angle $\hat{\theta}$.

In addition, in step 254, the impedance angle detection unit 150 is used to determine whether an absolute value of the first differential value ΔQ' of the third reactive power $Q_1'$ and the fourth reactive power $Q_2'$ is less than the first power reference value $Q_c$. If it is determined that the absolute value of the first differential value ΔQ' is less than the first power reference value $Q_c$, the impedance angle θ is the output impedance angle of the inverter (step 270). If it is determined that the absolute value of the first differential value ΔQ' is not less than the first power reference value $Q_c$, a direction of ΔQ' is further determined, that is, step 255 is performed. In one embodiment, approximately 5% of the inverter rated power is regarded as the first power reference value $Q_c$. If a value of the first power reference value $Q_c$ is smaller, a higher accuracy of the detection result is achieved.

In step 255, the impedance angle detection unit 150 is used to determine whether a product of the first differential value ΔQ' and the variance Δδ is larger than zero. If it is determined that the product of the first differential value ΔQ' and the variance Δδ is larger than zero, this indicates that the direction of the first differential value ΔQ' and the direction of the variance Δδ are the same. At this time, step 256 is performed, in which the impedance angle θ is set equal to a sum of a predetermined impedance angle $\hat{\theta}$ and the compensation angle $Δθ_0$, after which the routine returns back to step 220 to perform the foregoing steps again until it is determined that the absolute value of the first differential value ΔQ' is less than the first power reference value $Q_c$ in step 254, which indicates that the impedance angle θ is the output impedance angle of the inverter. If it is determined that the absolute value of the first differential value ΔQ' is not less than the first power reference value $Q_c$, this indicates that the direction of the first differential value ΔQ' and the direction of the variance Δδ are different from each other. At this time, step 257 is performed, in which the impedance angle θ is set equal to the predetermined impedance angle $\hat{\theta}$ minus the compensation angle $Δθ_0$, after which the routine returns back to step 220 to perform the foregoing steps again until it is determined that the absolute value of the first differential value ΔQ' is less than the first power reference value Qc in step 254, which indicates that the impedance angle θ is the output impedance angle of the inverter. In one embodiment, the compensation angle $Δθ_0$ can be set to be 5°. If a value of the compensation angle $Δθ_0$ is smaller, a higher accuracy of the detection result is achieved.

On the other hand, in step 240, if it is determined that the amplitude $U_c$ is not a constant value, step 261 is performed to calculate the variance $ΔU_c$ of the amplitude $U_c$. For example, if the amplitude $U_c$ changes from $U_1$ to $U_2$, the value of the power angle δ is a constant value, and the variance $ΔU_c=U_2-U_1$.

Moreover, steps 262~263 can be performed in advance, or performed after step 261. In step 262, the PQ calculation unit 130 is used to calculate the first active power $P_1$, the second active power $P_2$, the first reactive power $Q_1$ and the second reactive power $Q_2$ based on the second voltage signal $u_0$ and the current signal $i_0$. The first active power $P_1$ and the first reactive power $Q_1$ are calculation values when the amplitude is $U_1$. The second active power $P_2$ and the second reactive power $Q_2$ are calculation values when the amplitude is $U_2$. In step 263, the rotation changing unit 140 is used to calculate the third active power $P_1'$ and the fourth active power $P_2'$, and calculate a second difference ΔP' of the active power P' to be ΔP'=$P_2'-P_1'$ based on the first active power $P_1$, the second active power $P_2$, the first reactive power $Q_1$, the second reactive power $Q_2$ and a predetermined impedance angle $\hat{\theta}$. The third active power $P_1'$ is a calculation value of the first active power $P_1$, the first reactive power $Q_1$ and the predetermined impedance angle $\hat{\theta}$. The fourth active power $P_2'$ is a calculation value of the second active power $P_2$, the second reactive power $Q_2$ and the predetermined impedance angle $\hat{\theta}$.

Subsequently, in step 264, the impedance angle detection unit 150 is used to determine whether an absolute value of the second difference $\Delta P'$ of the third active power $P_1'$ and the fourth active power $P_2'$ is less than a second power reference value $P_c$. If it is determined that the absolute value of the second difference $\Delta P'$ is less than the second power reference value $P_c$, the impedance angle $\theta$ is the output impedance angle of the inverter (step 270). If it is determined that the absolute value of the second difference $\Delta P'$ is not less than the second power reference value $P_c$, a direction of $\Delta P'$ is further determined, that is, step 265 is performed. In one embodiment, approximately 5% of the inverter rated power is regarded as the second power reference value $P_c$. If a value of the second power reference value $P_c$ is smaller, a higher accuracy of the detection result is achieved.

In step 265, the impedance angle detection unit 150 is used to determine whether a product of the second difference $\Delta P'$ and the variance $\Delta U_c$ is larger than zero. If the product of the second difference $\Delta P'$ and the variance $\Delta U_c$ is larger than zero, this indicates that the direction of the second difference $\Delta P'$ and the direction of the variance $\Delta U_c$ are the same. At this time, step 266 is performed, in which the impedance angle $\theta$ is set equal to a predetermined impedance angle $\hat{\theta}$ minus the compensation angle $\Delta\theta_0$, after which the routine returns back to step 220 to perform the foregoing steps again until it is determined that the absolute value of the second difference $\Delta P'$ is less than the second power reference value $P_c$ in step 264, which indicates that the impedance angle $\theta$ is the output impedance angle of the inverter. If the product of the second difference $\Delta P'$ and the variance $\Delta U_c$ is not larger than zero, this indicates that the direction of the second difference $\Delta P'$ and the direction of the variance $\Delta U_c$ are different from each other. At this time, step 267 is performed, in which the impedance angle $\theta$ is set equal to the sum of the predetermined impedance angle $\hat{\theta}$ and the compensation angle $\Delta\theta_0$, after which the routine returns back to step 220 to perform the foregoing steps again until it is determined that the absolute value of the second difference $\Delta P'$ is less than the second power reference value $P_c$ in step 264, which indicates that the impedance angle $\theta$ is the output impedance angle of the inverter.

Figure 2B:
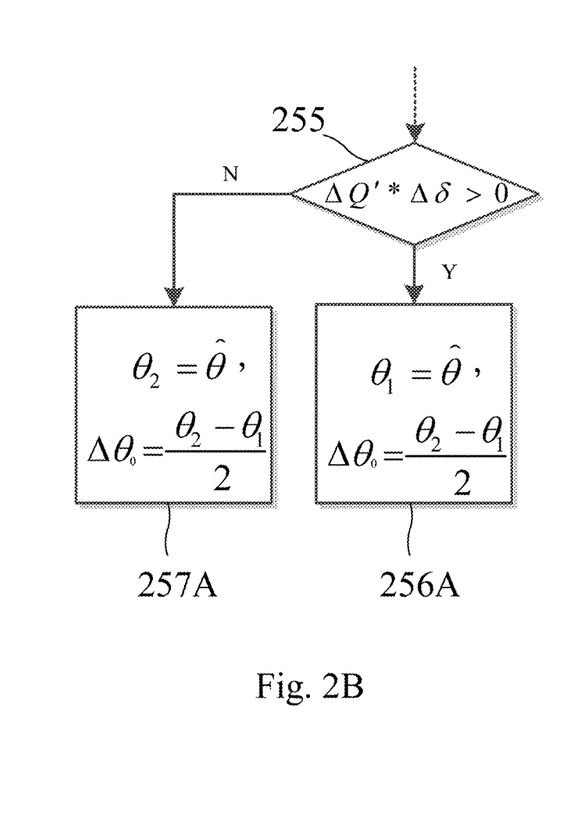
FIG. 2B is a portion of the flow diagram illustrating the process steps of a detecting method for detecting an output impedance angle of an inverter as shown in FIG. 2A according to embodiments of the present disclosure.

In another embodiment, the detecting device 100 and the detecting method 200 for detecting an output impedance angle of an inverter can also employ binary search, which will be described below. It is noted that the maximum value and the minimum value of the impedance angle $\theta$ are $\theta_2$ and $\theta_1$, respectively. For example, the maximum value $\theta_2$ of the impedance angle can be 90°, and the minimum value $\theta_1$ of the impedance angle is 0°. For facilitating understanding of the binary search, reference is now made to FIG. 2B, which is a portion of the flow diagram illustrating the process steps of a detecting method for detecting an output impedance angle of an inverter as shown in FIG. 2A according to embodiments of the present disclosure. It is noted that FIG. 2B only depicts step 255 in FIG. 2A for introducing another embodiment of step 255, and therefore, FIG. 2B does not illustrate all steps of the detecting method 200 for detecting an output impedance angle of an inverter. In step 255, if it is determined that the product of the first differential value $\Delta Q'$ and variance $\Delta\delta$ is larger than zero, step 256A is performed, in which the minimum value $\theta_1$ of the impedance angle is set equal to the predetermined impedance angle $\hat{\theta}$ an angle difference is obtained by subtracting the predetermined impedance angle $\hat{\theta}$ from the maximum value $\theta_2$ of the impedance angle, and the compensation angle $\Delta\theta_0$ is obtained by dividing the angle difference by two. In addition, in step 255, if it is determined that the product of the first differential value $\Delta Q'$ and the variance $\Delta\delta$ is not larger than zero, step 257A is performed, in which the maximum value $\theta_2$ of the impedance angle is set equal to the predetermined impedance angle $\hat{\theta}$, an angle difference is obtained by subtracting the minimum value $\theta_1$ of the impedance angle from the predetermined impedance angle $\hat{\theta}$, and the compensation angle $\Delta\theta_0$ is obtained by dividing the angle difference by two.

Figure 2C:
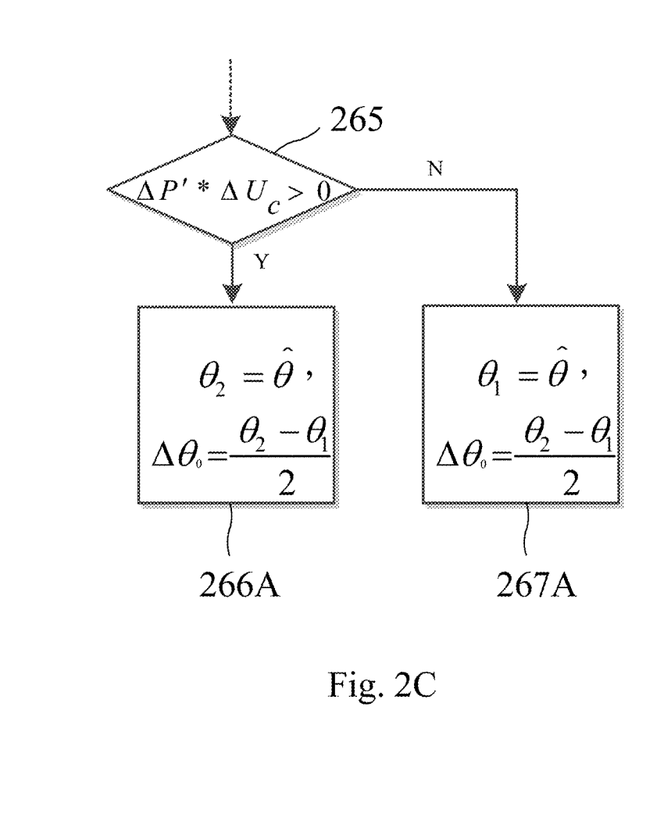
FIG. 2C is a portion of the flow diagram illustrating the process steps of a detecting method for detecting an output impedance angle of an inverter as shown in FIG. 2A according to embodiments of the present disclosure.

The binary search procedure will be further described in accordance with yet another embodiment. For facilitating understanding of the binary search, reference is now made to FIG. 2C, which is a portion of the flow diagram illustrating the process steps of a detecting method for detecting an output impedance angle of an inverter as shown in FIG. 2A according to embodiments of the present disclosure. It is noted that FIG. 2C only depicts step 265 in FIG. 2A for introducing another embodiment of step 265, and therefore, FIG. 2C does not illustrate all steps of the detecting method 200 for detecting an output impedance angle of an inverter. In step 265, if it is determined that the product of the second difference $\Delta P'$ and the variance $\Delta U_c$ is larger than zero, step 266A is performed, in which the maximum value $\theta_2$ of the impedance angle is set equal to the predetermined impedance angle $\hat{\theta}$, an angle difference is obtained by subtracting the minimum value $\theta_1$ of the impedance angle from the predetermined impedance angle $\hat{\theta}$, and the compensation angle $\Delta\theta_0$ is obtained by dividing the angle difference by two. In addition, in step 265, if it is determined that the product of the second difference $\Delta P'$ and the variance $\Delta U_c$ is not larger than zero, step 267A is performed, in which the minimum value $\theta_1$ of the impedance angle is set equal to the predetermined impedance angle 9, an angle difference is obtained by subtracting the predetermined impedance angle $\hat{\theta}$ from the maximum value $\theta_2$ of the impedance angle, and the compensation angle $\Delta\theta_0$ is obtained by dividing the angle difference by two.

Figure 3:
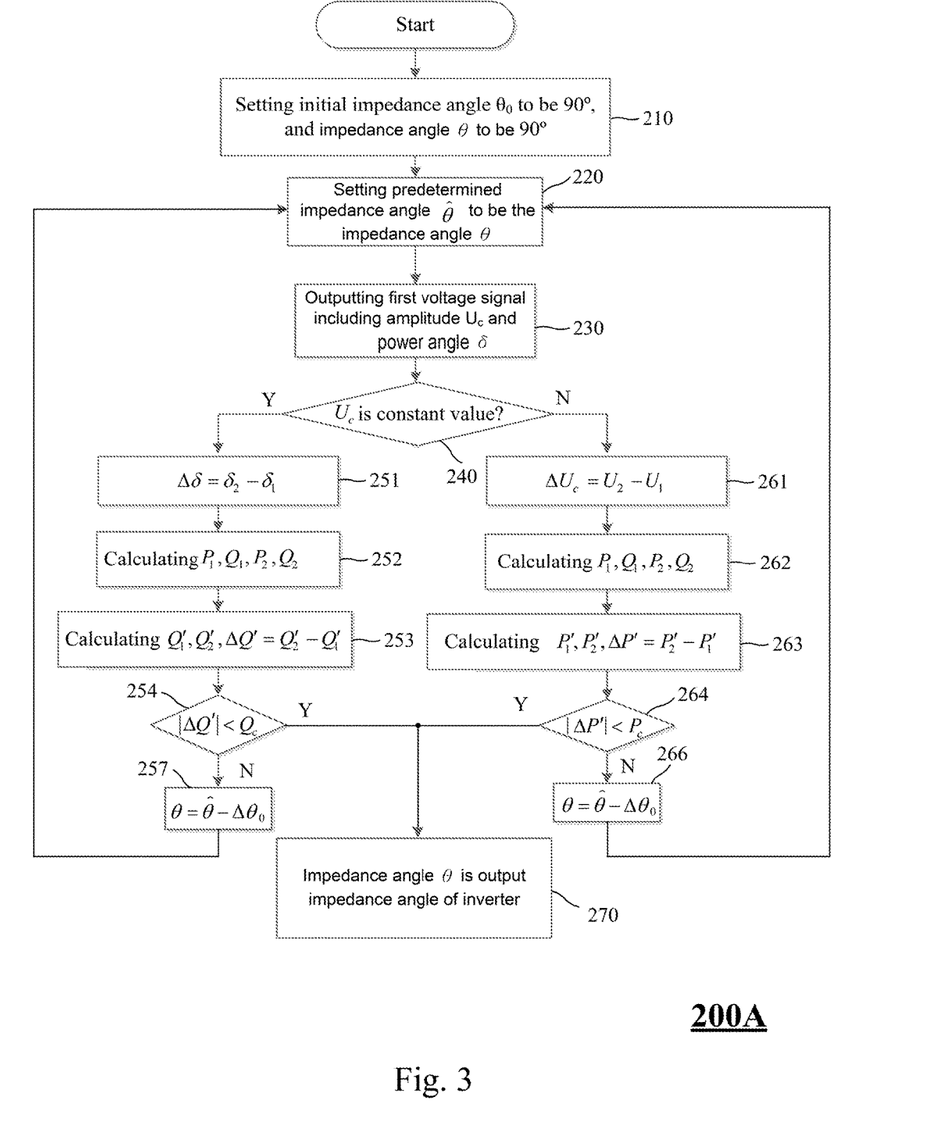
FIG. 3 is a flow diagram illustrating the process steps of a detecting method for detecting an output impedance angle of an inverter according to embodiments of the present disclosure.

FIG. 3 is a flow diagram illustrating the process steps of a detecting method for detecting an output impedance angle of an inverter according to embodiments of the present disclosure. The difference between a detecting method 200A for detecting an output impedance angle of an inverter in FIG. 3 and the detecting method 200 for detecting an output impedance angle of an inverter in FIG. 2 is the steps 210, 254, 264. In step 210, the initial impedance angle $\theta_0$ is set to be 90°, and the impedance angle $\theta$ is also set to be 90°. Hence, in step 220, the predetermined impedance angle $\hat{\theta}$ is set to be the impedance angle $\theta$. In this situation, referring to step 254, if it is determined that the absolute value of the first differential value $\Delta Q'$ is not less than the first power reference value $Q_c$ the impedance angle $\theta$ is set equal to the predetermined impedance angle $\hat{\theta}$ minus the compensation angle $\Delta\theta_0$. In addition, referring to step 264, if it is determined that the absolute value of the second difference $\Delta P'$ is not less than the second power reference value $P_c$, the impedance angle $\theta$ is set equal to the predetermined impedance angle $\hat{\theta}$ minus the compensation angle $\Delta\theta_0$. It is noted that other steps in the detecting method 200A for detecting an output impedance angle of an inverter in FIG. 3 are the same as steps in the detecting method 200 for detecting an output impedance angle of an inverter in FIG. 2, and a detailed description regarding such other steps in FIG. 3 will be omitted herein for the sake of brevity.

Figure 4:
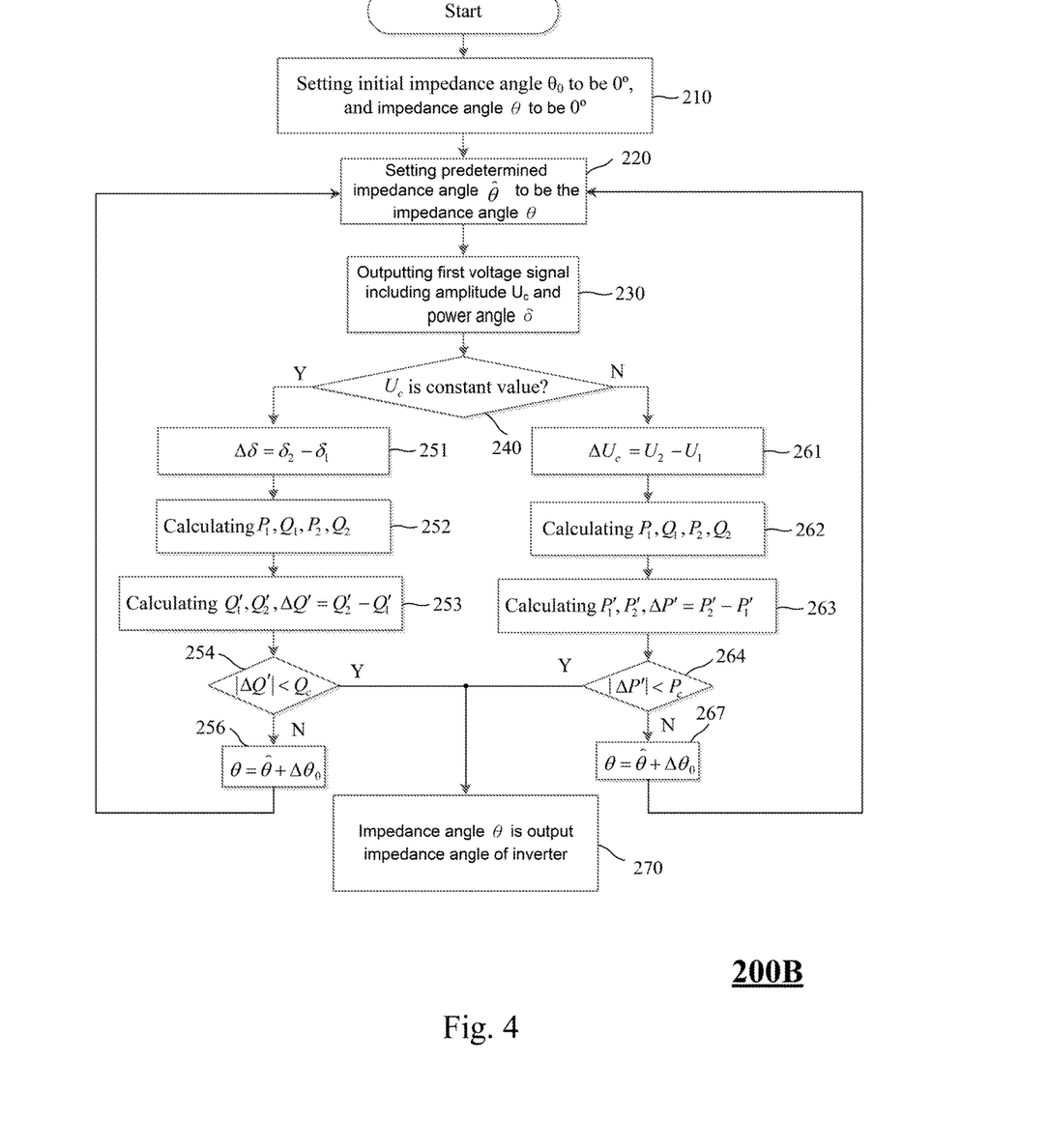
FIG. 4 is a flow diagram illustrating the process steps of a detecting method for detecting an output impedance angle of an inverter according to embodiments of the present disclosure.

FIG. 4 is a flow diagram illustrating the process steps of a detecting method for detecting an output impedance angle of an inverter according to embodiments of the present disclosure. The difference between a detecting method 200B for detecting an output impedance angle of an inverter in FIG. 4 and the detecting method 200 for detecting an output impedance angle of an inverter in FIG. 2 is the steps 210, 254, 264. In step 210, the initial impedance angle $\theta_0$ is set to be 0°, and the impedance angle $\theta$ is also set to be 0°. Hence, in step 220, the predetermined impedance angle $\hat{\theta}$ is set to be the impedance angle $\theta$. In this situation, referring to step 254, if it is determined that the absolute value of the first differential value $\Delta Q'$ is not less than the first power reference value $Q_c$, the impedance angle $\theta$ is set equal to a sum of the predetermined impedance angle $\hat{\theta}$ and the compensation angle $\Delta\theta_0$. In addition, referring to step 264, if it is determined that the absolute value of the second difference $\Delta P'$ is not less than the second power reference value $P_c$, the impedance angle $\theta$ is set equal to a sum of the predetermined impedance angle $\hat{\theta}$ and the compensation angle $\Delta\theta_0$. It is noted that other steps in the detecting method 200B for detecting an output impedance angle of an inverter in FIG. 4 are the same as steps in the detecting method 200 for detecting an output impedance angle of an inverter in FIG. 2, and a detailed description regarding such other steps in FIG. 4 will be omitted herein for the sake of brevity.

Figure 5A:
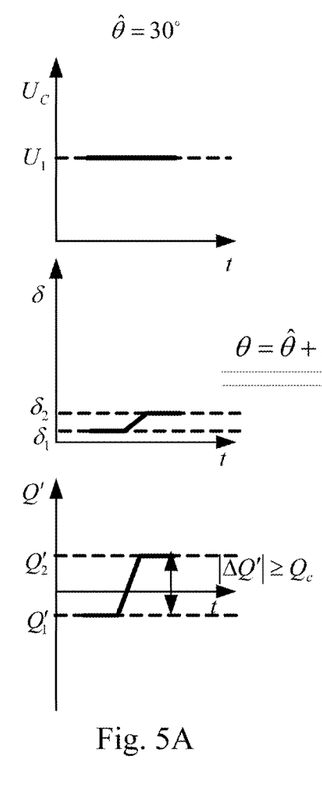
FIG. 5A is an operation diagram illustrating the process steps of a detecting method for detecting an output impedance angle of an inverter according to embodiments of the present disclosure.
Figure 5B:
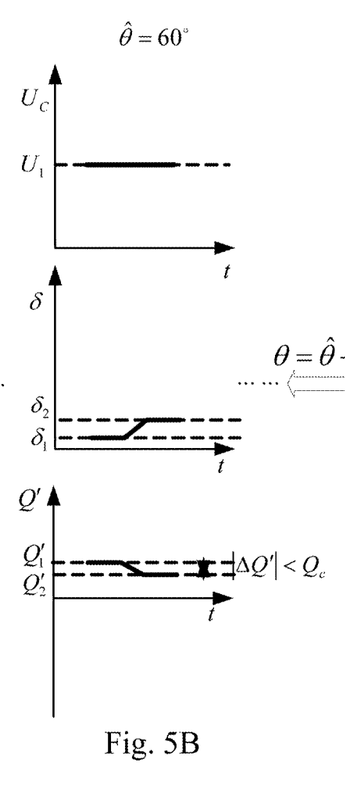
FIG. 5B is an operation diagram illustrating the process steps of a detecting method for detecting an output impedance angle of an inverter according to embodiments of the present disclosure.
Figure 5C:
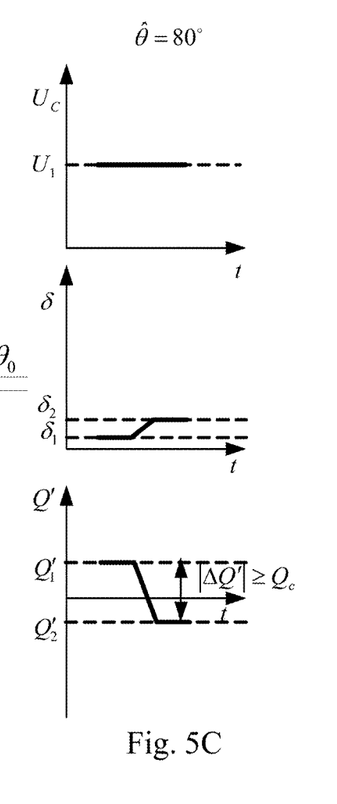
FIG. 5C is an operation diagram illustrating the process steps of a detecting method for detecting an output impedance angle of an inverter according to embodiments of the present disclosure.

FIGS. 5A~5C are operation diagrams illustrating the process steps of a detecting method for detecting an output impedance angle of an inverter according to embodiments of the present disclosure. First of all, a first voltage signal $U_c=U_1$ is input, and the power angle $\delta$ changes from $\delta_1$ to $\delta_2$. If it is detected that $\Delta Q'*\Delta\delta>0$ and $|\Delta Q'|\geq Qc$, as shown in FIG. 5A, the impedance angle $\theta$ is set as $\theta=\hat{\theta}+\Delta\theta_0$ and the routine returns to step 220 until $|\Delta Q'|<Qc$. As shown in FIG. 5B, the detection is completed, the impedance angle $\theta$ is 60°, and the output impedance angle of the inverter is the impedance angle $\theta$. In addition, if it is detected that $\Delta Q'*\Delta\delta<0$ and $|\Delta Q'|\geq Qc$, as shown in FIG. 5C, the impedance angle $\theta$ is set as $\theta=\hat{\theta}-\Delta\theta_0$ and the routine returns to step 220 until $|\Delta Q'|<Qc$. As shown in FIG. 5B, the detection is completed, the impedance angle $\theta$ is 60°, and the output impedance angle of the inverter is the impedance angle $\theta$.

Figure 6A:
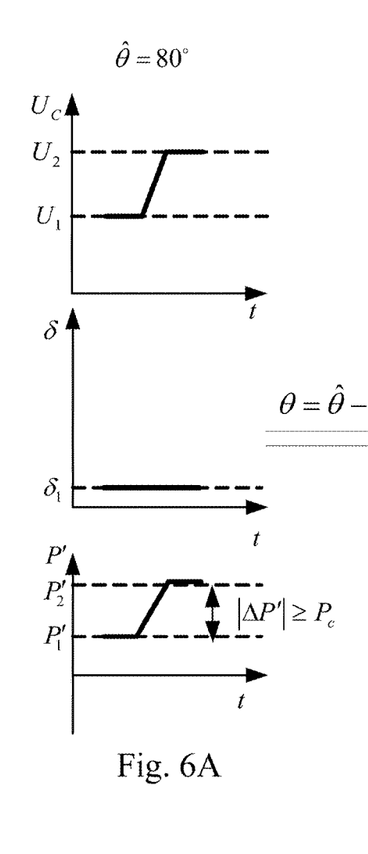
FIG. 6A is an operation diagram illustrating the process steps of a detecting method for detecting an output impedance angle of an inverter according to embodiments of the present disclosure.
Figure 6B:
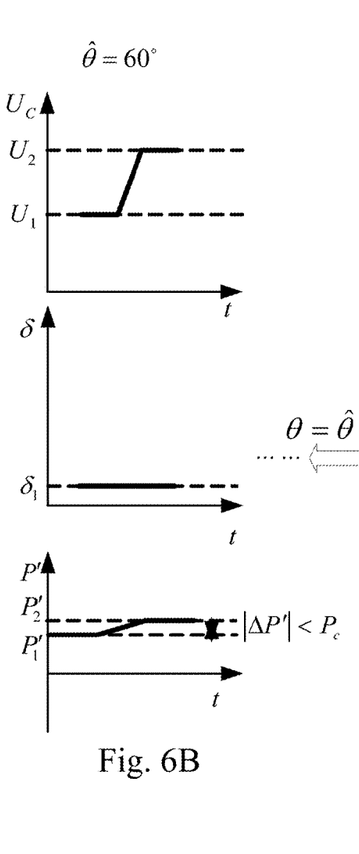
FIG. 6B is an operation diagram illustrating the process steps of a detecting method for detecting an output impedance angle of an inverter according to embodiments of the present disclosure.
Figure 6C:
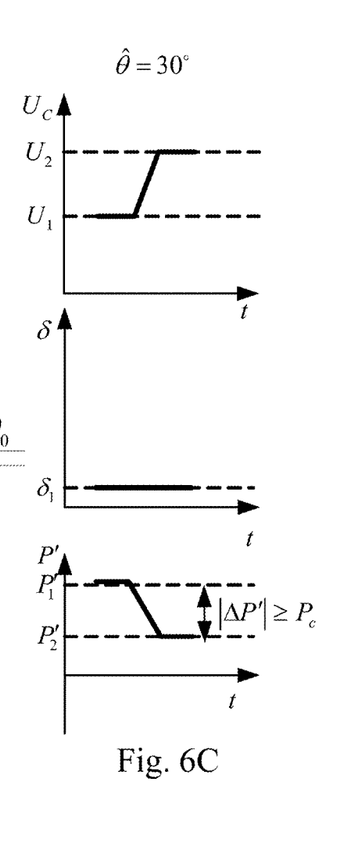
FIG. 6C is an operation diagram illustrating the process steps of a detecting method for detecting an output impedance angle of an inverter according to embodiments of the present disclosure.

FIGS. 6A~6C are operation diagrams illustrating the process steps of a detecting method for detecting an output impedance angle of an inverter according to embodiments of the present disclosure. First of all, a first voltage signal $U_c$ changes from $U_1$ to $U_2$, and the value of the power angle $\delta$ is a constant value. If it is detected that $\Delta P'*\Delta Uc>0$ and $|\Delta P'|\geq P_c$, as shown in FIG. 6A, the impedance angle $\theta$ is set as $\theta=\hat{\theta}-\Delta\theta_0$ and the routine returns to step 220 until $|\Delta P'|<Pc$. As shown in FIG. 6B, the detection is completed, the impedance angle $\theta$ is 60°, and the output impedance angle of the inverter is the impedance angle $\theta$. In addition, if it is detected that $\Delta P'*\Delta Uc<0$ and $|\Delta P'|\geq P_c$, as shown in FIG. 6C, the impedance angle $\theta$ is set as $\theta=\hat{\theta}+\Delta\theta_0$ and the routine returns to step 220 until $|\Delta P'|<P_c$. As shown in FIG. 6B, the detection is completed, the impedance angle $\theta$ is 60°, and the output impedance angle of the inverter is the impedance angle $\theta$.

As may be appreciated by persons having ordinary skill in the art, the steps of the detecting method for detecting an output impedance angle of an inverter are named according to the function they perform, and such naming is provided to facilitate the understanding of the present disclosure but not to limit the steps. Combining the steps into a single step or dividing any one of the steps into multiple steps, or switching any step so as to be a part of another step falls within the scope of the embodiments of the present disclosure.

In view of the above embodiments of the present disclosure, it is apparent that the application of the present disclosure has a number of advantages. Embodiments of the present disclosure provide a detecting device and a detecting method for detecting an output impedance angle of an inverter so as to detect an output impedance angle of the inverter simply and precisely, and ultimately enable efficient control of the inverter.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A detecting method for detecting an output impedance angle of an inverter, comprising:
   (a) providing a first voltage signal, wherein the first voltage signal comprises an amplitude and a power angle, one of the amplitude and the power angle is a variable value, and the other one of the amplitude and the power angle is a constant value;
   (b) controlling an inverter to output a second voltage signal and a current signal based on the first voltage signal;
   (c) calculating and outputting a first active power, a second active power, a first reactive power, and a second reactive power based on the second voltage signal and the current signal;
   (d) setting an impedance angle to be an initial impedance angle;
   (e) setting a predetermined impedance angle to be the impedance angle;
   (f) calculating and outputting a third active power, a fourth active power, a third reactive power, and a fourth reactive power based on the first active power, the second active power, the first reactive power, the second reactive power, and the predetermined impedance angle;
   (g) determining whether the amplitude is a constant value;
   (h) if it is determined that the amplitude is a constant value, determining whether an absolute value of a first differential value of the third reactive power and the fourth reactive power is less than a first power reference value;
      (i) if it is determined that the absolute value of the first differential value is less than the first power reference value, setting the output impedance angle of the inverter as the impedance angle;
      (j) if it is determined that the absolute value of the first differential value is not less than the first power reference value, setting the impedance angle as a sum of the predetermined impedance angle and a compensation angle or as the predetermined impedance angle minus the compensation angle, and repeating step (e) to step (h) until it is determined that the absolute value of the first differential value is less than the first power reference value in step (i);

(k) if it is determined the amplitude is not a constant value, determining whether an absolute value of the second differential value of the third active power and the fourth active power is less than a second power reference value;

(l) if it is determined that the absolute value of the second differential value is less than the second power reference value, setting the output impedance angle of the inverter as the impedance angle;

(m) if it is determined that the absolute value of the second differential value is not less than the second power reference value, setting the impedance angle equal to the sum of the predetermined impedance angle and the compensation angle or to the predetermined impedance angle minus the compensation angle, and repeating step (e), step (f), step (g), step (k) until it is determined that the absolute value of the second differential value is less than the second power reference value in step (l).

2. The detecting method of claim 1, wherein the initial impedance angle is set as a maximum value, and wherein if it is determined that the absolute value of the first differential value is not less than the first power reference value, setting the impedance angle equal to the sum of the predetermined impedance angle and the compensation angle or to the predetermined impedance angle minus the compensation angle comprises:
if it is determined that the absolute value of the first differential value is not less than the first power reference value, setting the impedance angle equal to the predetermined impedance angle minus the compensation angle.

3. The detecting method of claim 1, wherein the initial impedance angle is set as a maximum value, and wherein if it is determined that the absolute value of the second difference is not less than the second power reference value, setting the impedance angle equal to the sum of the predetermined impedance angle and the compensation angle or to the predetermined impedance angle minus the compensation angle comprises:
if it is determined that the absolute value of the second difference is not less than the second power reference value, setting the impedance angle equal to the predetermined impedance angle minus the compensation angle.

4. The detecting method of claim 1, wherein the initial impedance angle is set as a minimum value, and wherein if it is determined that the absolute value of the first differential value is not less than the first power reference value, setting the impedance angle equal to the sum of the predetermined impedance angle and the compensation angle or to the predetermined impedance angle minus the compensation angle comprises:
if it is determined that the absolute value of the first differential value is not less than the first power reference value, setting the impedance angle equal to the sum of the predetermined impedance angle and the compensation angle.

5. The detecting method of claim 1, wherein the initial impedance angle is set as a minimum value, and wherein if it is determined that the absolute value of the second difference is not less than the second power reference value, setting the impedance angle equal to the sum of the predetermined impedance angle and the compensation angle or to the predetermined impedance angle minus the compensation angle comprises:
if it is determined that the absolute value of the second difference is not less than the second power reference value, setting the impedance angle equal to the sum of the predetermined impedance angle and the compensation angle.

6. The detecting method of claim 1, wherein the first active power and the first reactive power are an active power and a reactive power before value changes, and the second active power and the second reactive power is an active power and a reactive power after value changes.

7. The detecting method of claim 1, wherein if it is determined that the absolute value of the first differential value is not less than the first power reference value, setting the impedance angle equal to the sum of the predetermined impedance angle and the compensation angle or to the predetermined impedance angle minus the compensation angle comprises:
if it is determined that the absolute value of the first differential value is not less than the first power reference value, calculating a first variance of the power angle, and determining whether a product of the first differential value and the first variance is larger than zero;
if it is determined that the product of the first differential value and the first variance is larger than zero, setting the impedance angle equal to the sum of the predetermined impedance angle and the compensation angle;
if it is determined that the product of the first differential value and the first variance is not larger than zero, setting the impedance angle equal to the predetermined impedance angle minus the compensation angle.

8. The detecting method of claim 7, wherein if it is determined that the product of the first differential value and the first variance is larger than zero, setting the impedance angle equal to the sum of the predetermined impedance angle and the compensation angle comprises:
if it is determined that the product of the first differential value and the first variance is larger than zero, setting a minimum value of the impedance angle as the predetermined impedance angle;
obtaining an angle difference by subtracting the predetermined impedance angle from a maximum value of the impedance angle; and
obtaining the compensation angle by dividing the angle difference by two;
wherein if it is determined that the product of the first differential value and the first variance is not larger than zero, setting the impedance angle equal to the predetermined impedance angle minus the compensation angle comprises:
if it is determined that the product of the first differential value and the first variance is not larger than zero, setting the maximum value of the impedance angle as the predetermined impedance angle;
obtaining the angle difference by subtracting the minimum value of the impedance angle from the predetermined impedance angle; and
obtaining the compensation angle by dividing the angle difference by two.

9. The detecting method of claim 1, wherein if it is determined that the absolute value of the second difference is not less than the second power reference value, setting the impedance angle equal to the sum of the predetermined impedance angle and the compensation angle or to the predetermined impedance angle minus the compensation angle comprises:

if it is determined that the absolute value of the second difference is not less than the second power reference value, calculating a second variance of the amplitude, and determining whether a product of the second difference and the second variance is larger than zero;

if it is determined that the product of the second difference and the second variance is larger than zero, setting the impedance angle equal to the predetermined impedance angle minus the compensation angle;

if it is determined that the product of the second difference and the second variance is not larger than zero, setting the impedance angle equal to the sum of the predetermined impedance angle and the compensation angle.

10. The detecting method of claim 9, wherein if it is determined that the product of the second difference and the second variance is larger than zero, setting the impedance angle equal to the predetermined impedance angle minus the compensation angle comprises:

if it is determined that the product of the second difference and the second variance is larger than zero, setting a maximum value of the impedance angle as the predetermined impedance angle;

obtaining an angle difference by subtracting a minimum value of the impedance angle from the predetermined impedance angle; and     obtaining the compensation angle by dividing the angle difference by two;

wherein if it is determined that the product of the second difference and the second variance is not larger than zero, setting the impedance angle equal to the sum of the predetermined impedance angle and the compensation angle comprises:

if it is determined that the product of the second difference and the second variance is not larger than zero, setting the minimum value of the impedance angle as the predetermined impedance angle;

obtaining the angle difference by subtracting the predetermined impedance angle from the maximum value of the impedance angle; and     obtaining the compensation angle by dividing the angle difference by two.

\* \* \* \* \*